United States Patent [19]

Wozniczka

[11] Patent Number: 4,728,302
[45] Date of Patent: Mar. 1, 1988

[54] MOUNTING COUPLING AND HEAT SINK ASSEMBLY FOR AXIAL LEAD COMPONENTS

[75] Inventor: George Wozniczka, Chicago, Ill.

[73] Assignee: Zenith Electronics Corporation, Glenview, Ill.

[21] Appl. No.: 887,577

[22] Filed: Jul. 17, 1986

[51] Int. Cl.$^4$ .............................................. H05U 3/30
[52] U.S. Cl. ...................... 439/620; 29/837; 439/876
[58] Field of Search ......... 339/17 LL, 17 N, 176 MP, 339/253 F, 252 F, 252 C, 178; 29/837, 838, 844; 439/620, 876

[56] References Cited

U.S. PATENT DOCUMENTS 2,659,063 11/1953 Webb et al. ...................... 339/253 F Primary Examiner—Timothy V. Eley

[57] ABSTRACT

A generally rectangular, flat, conductive metal sheet is formed and provided with a predetermined array of apertures and slots by stamping. The sheet is generally comprised of first and second lateral sections and upper and lower center sections which are each coupled to a respective lateral section by a thin jumper, or bridge, element or elements. Each section further includes a mounting/terminal pin extending from a respective lower edge thereof. The sheet is then bent such as by automatic handling apparatus along three spaced axes located between or extending through the various sections and along and parallel to the length of the sheet from top to bottom so as to form a generally "E"-shaped structure when viewed from above. Four axial lead diodes are then inserted within respective pairs of facing slots within the lateral and center sections and are soldered in place. The thin jumper elements are then broken away, forming a diode bridge which may then be coupled in circuit and mounted upon a printed circuit (PC) board by inserting and soldering each of the mounting/terminal pins in a respective aperture in the PC board. The four metal sections provide support for the four diodes and electrical coupling of the diodes to each other as well as the PC board-mounted circuitry and serve as a built-in heat sink integral with the bridge circuit. The flat, conductive metal sheet may be provided with various numbers of sections and slot arrangement to form a variety of circuits comprised of axial lead components.

11 Claims, 8 Drawing Figures

MOUNTING COUPLING AND HEAT SINK ASSEMBLY FOR AXIAL LEAD COMPONENTS

BACKGROUND OF THE INVENTION

This invention relates generally to the mounting and coupling in circuit of electronic components and is particularly directed to an improved arrangement for mounting, cooling and coupling in circuit axial lead electronic components.

A rectifier circuit is used to convert alternating current such as from a line source to a direct current. Rectifier circuits are generally comprised of a diode bridge which makes use of four diodes coupled in such a manner so as to provide a direct current output. The diodes typically used are semiconductors having a pair of axial leads, with each lead extending from opposite ends thereof. When using axial lead diodes, the limiting operating factor of the diode bridge at high currents is the diode junction temperature. Excessively high junction temperatures tend to cause diode failure and result in a corresponding reduction in diode reliability and operating life.

Prior art attempts to reduce diode junction temperature have generally involved the coupling of a heat sink to one or both of the diode leads. However, in the case of diode bridges wherein the four diodes are encapsulated in a single housing, intimate contact between the diodes and a heat sink is generally not possible. Moreover, encapsulation of the bridge components tends to substantially increase their operating temperatures such that an efficient means for cooling these components is essential in this environment. Many prior art semiconductor encapsulation packages include a thermal transfer plate integrally formed with the plastic encapsulation package. The thermal transfer plate is typically connected to an external heat dissipator, or sink. This arrangement, however, suffers from heat dissipation limitations arising from the coupling between the encapsulated device's thermal transfer plate and the external heat dissipator. This coupling typically takes the form of a threaded coupler such as a screw or a solder junction, with both approaches offering only limited heat transfer between the plate and the heat sink.

The present invention is intended to overcome the aforementioned limitations of the prior art and provides various desired operating, structural, manufacturing and assembly characteristics in a mounting, coupling and heat sink assembly for electronic components which may be used in virtually any circuit employing axial lead components, but is described in detail below in an embodiment particularly adapted for use in a rectifying bridge circuit comprised of four axial lead diodes.

OBJECTS OF THE INVENTION

Accordingly, it is an object of the present invention to provide an improved arrangement for the mounting, cooling and coupling in circuit of axial lead electronic components.

It is another object of the present invention to provide a unitary structure for receiving a plurality of axial lead diodes in forming a rectifying bridge circuit.

It is yet another object of the present invention to provide an improved structure for mounting and connecting a plurality of coupled electronic components in circuit on a PC board.

A further object of the present invention is to provide a diode bridge circuit with increased current carrying capacity.

A still further object of the present invention is to provide an electronic circuit having an integrated heat sink which also serves as a current carrier for improved circuit heat dissipation.

Yet another object of the present invention is to provide improved cooling for an electronic device by having a conductor also serve as a heat sink.

Still another object of the present invention is to provide a diode bridge arrangement requiring minimum PC board mounting area.

Another object of the present invention is to eliminate the requirement for a separate heat sink for a large current carrying electronic device.

A yet further object of the present invention is to provide a single means for mounting, coupling in circuit, and reducing the junction temperature of an axial lead electronic component.

Still another object of the present invention is to provide a low cost and reliable axial lead diode bridge.

It is another object of the present invention to provide a component mounting and electrical coupling structure which accommodates electronic component dimensional changes with operating temperature variations and thus eliminates electronic component mechanical stress.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
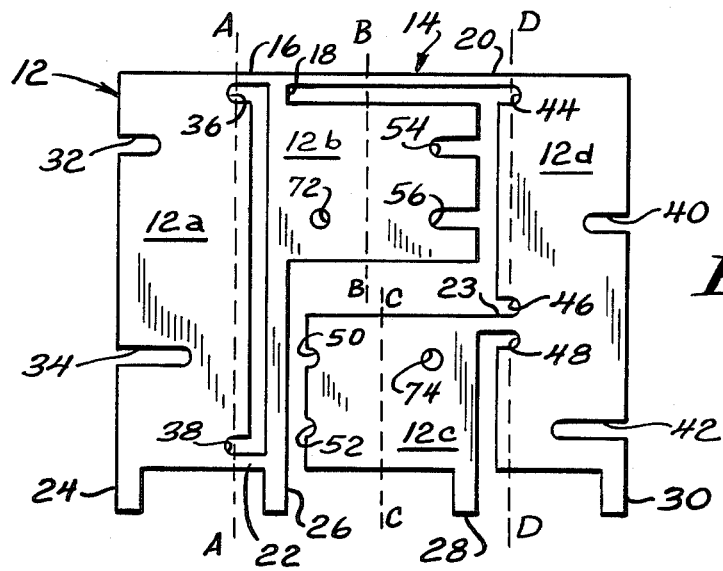
FIG. 1 is a front view of a flat conductive sheet for use in forming the mounting, coupling and heat sink assembly for axial lead components of the present invention.
Figure 5:
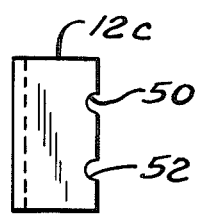
FIG. 5 is a sectional view of the folded conductive sheet of FIG. 3 taken along sight line 5—5 therein.
Figure 6:
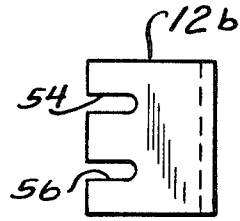
FIG. 6 is a sectional view taken along sight line 6—6 in FIG. 3 of the folded conductive sheet illustrated therein.
Figure 7:
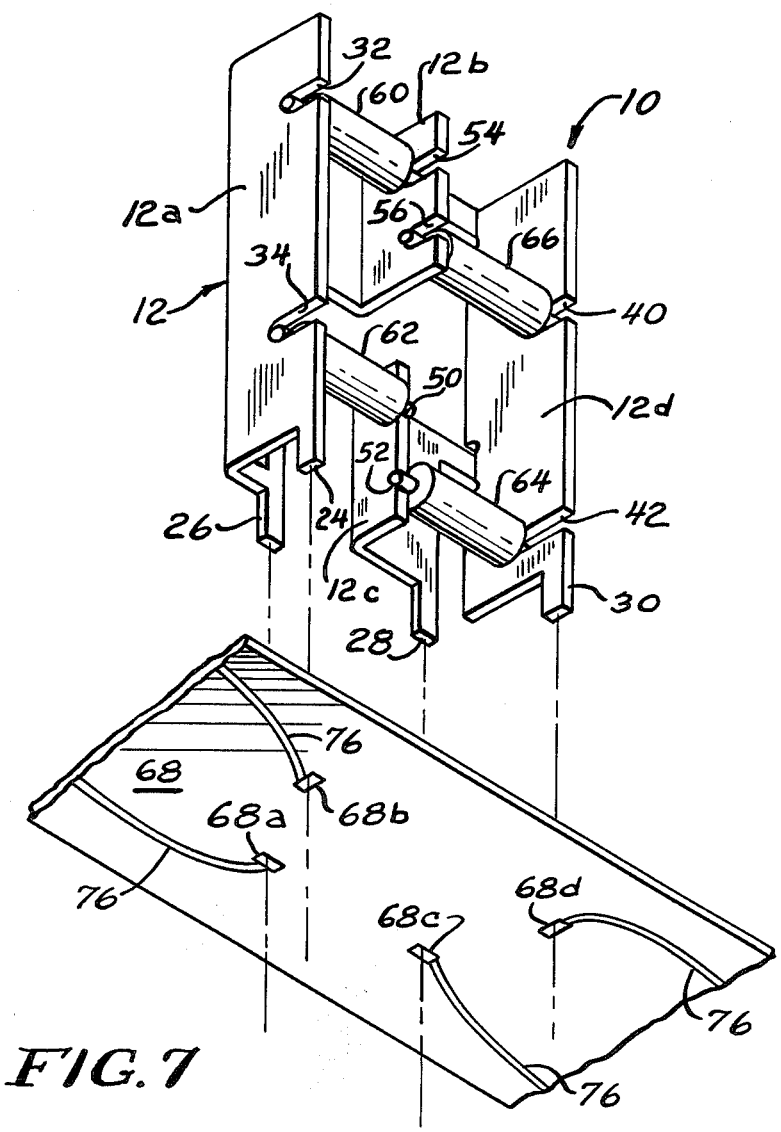
FIG. 7 illustrates the manner in which a mounting, coupling and heat sink assembly in accordance with the present invention may be mounted upon and coupled in circuit on a PC board.

Referring to FIGS. 1-6, there are shown various views of a frame 12 forming a mounting, coupling and heat sink assembly 10 in an electronic apparatus in accordance with the present invention as illustrated in FIG. 7. The frame 12 is initially in the form of a flat sheet as illustrated in FIG. 1 and is comprised of an electrically and thermally conductive material. The frame 12 serves as a blank in forming the mounting, coupling and heat sink assembly 10 used in the present invention which may be formed by conventional means such as punching or stamping employing conventional machine technology. The blank thus formed is provided with a plurality of slots and apertures therein depending upon the circuit in which the mounting, coupling and heat sink assembly 10 is to be used as described below. The present invention is intended for use with axial lead components, such as diodes and resistors, and may be used to form a circuit comprised of virtually any combination of axial lead components and positioned upon and coupled in circuit with a PC board. Therefore, while the mounting, coupling and heat sink assembly 10 of the present invention is described herein for use with four axial lead diodes in forming a rectifying bridge circuit, the present invention is not limited to this circuit arrangement, which is intended to serve as only one example of the various circuit applications in which the present invention may be used.

The frame 12 is generally divided into first and second outer sections 12a, 12d and third and fourth inner sections 12b, 12c. In addition, the first outer section 12a is provided with first and second outer slots 32 and 34, and the second outer section 12d is also provided with first and second outer slots 40 and 42. Similarly, the third inner section 12b is provided with first and second slots 54, 56, and the fourth inner section 12c is also provided with first and second slots 50, 52. The slots in the first and second outer sections 12a, 12d are provided in the respective outer edge portions thereof. Similarly, the first and second slots in each of the third and fourth inner sections 12b, 12c are provided respectively on the right and left edge portions thereof as viewed in FIG. 1.

The frame 12 is adapted for bending along four parallel, spaced axes designated by the letters A—A, B—B, C—C and D—D. As shown in FIG. 1, axis A—A is positioned between the first outer section 12a and the third inner section 12b. Similarly, axis D—D is positioned between the second outer section 12d and the third and fourth inner sections 12b and 12c. Another axis, B—B intersects the third inner section 12b, while axis C—C intersects the fourth inner section 12c. All of the aforementioned axes are aligned along the length of the frame 12 from top to bottom. With frame 12 bent along axes A—A, B—B, C—C and D—D, it assumes the shape as illustrated in FIGS. 2-4 and has the appearance of an "E" when viewed from above.

The first outer section 12a and the third inner section 12b are coupled by a pair of jumper portions 16 and 22. An inner slot 36 is positioned in the first outer section 12a immediately adjacent to the jumper portion 16. Similarly, another inner slot 38 is positioned in the first outer section 12a immediately adjacent to the jumper portion 22 positioned between the first outer section and the third inner section 12b. An upper bridge or jumper section 14 includes the jumper portion 16 and is coupled between the first and second outer section 12a, 12d and the third inner section 12b. The upper bridge 14 is respectively coupled to the first outer section 12a, the second outer section 12d, and the third inner section 12b by means of the aforementioned jumper portions 16, 18 and 20. Positioned immediately adjacent to the jumper portion 20 and within the second outer section 12d is an inner slot 44.

The fourth inner section 12c is coupled to the second outer section 12d by means of a jumper member 23. Positioned within the fourth inner section 12d and respectively disposed immediately above and below the jumper member 23 are inner slots 46, 48.

Figure 2:
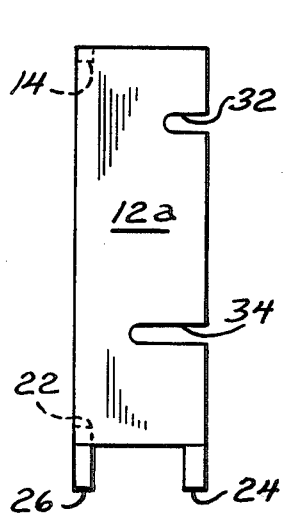
FIGS. 2, 3 and 4 are respectively a right lateral view, a left lateral view, and a front view of the conductive sheet of FIG. 1 bent along a plurality of spaced, parallel axes for receiving axial lead components.
Figure 3:
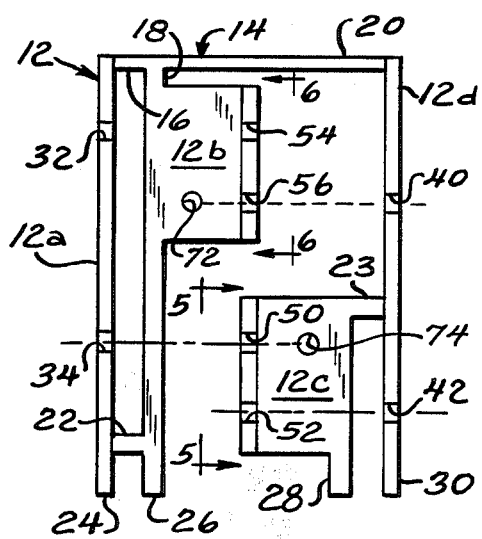
Figure 4:
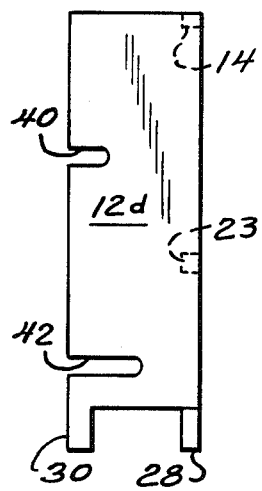

With the frame 12 bent along the four aforementioned, parallel axes, as shown in FIGS. 2-4, various slots in the facing, adjacent sections of the frame will be aligned to receive the axial leads of an electronic component. For example, with the frame 12 bent along axes A—A and B—B, the first outer slot 32 in the first outer section 12a will be aligned with the first slot 54 in the third inner section 12b. Similarly, with the frame 12 bent along axes A—A and C—C, the second outer slot 34 in the first outer section 12a will be aligned with the first slot 50 in the fourth inner section 12c. Bending of the frame 12 along axes B—B and D—D will result in alignment of the first outer slot 40 in the second outer section 12d with the second slot 56 in the third inner section 12b. Similarly, bending of the frame 12 along axes C—C and D—D will place the second outer slot 42 in the second outer section 12d in alignment with the second slot 52 in the fourth inner section 12c. The length of the slots in the third and fourth inner sections 12b, 12c as well as the length of the slots in the first and second outer sections 12a, 12d is determined by the location of the bending axes B—B and C—C along the respective lengths of the third and fourth inner sections 12b, 12c. The lengths of the various aforementioned slots are selected so that the inner ends of corresponding, adjacent slots are in alignment whereby, with the respective axial leads of an electronic component positioned in contact with the inner edges of adjacent, corresponding slots, the longitudinal axis of the axial lead component will be aligned generally perpendicular to the various aforementioned sections which have been bent so as to assume a facing, parallel alignment with an adjacent bent section. The first and second inner slots 36, 38 within the first outer section 12a facilitate bending of the frame 12 along axis A—A. Similarly, the first, second and third inner slots 44, 46 and 48 in the second outer section 12d facilitate bending of the frame 12 along axis D—D.

With the frame 12 bent as illustrated in FIGS. 2-4, the leads of a plurality of axial lead components 60, 62, 64 and 66 are inserted within aligned slots in facing, adjacent sections of the frame 12 as shown in FIG. 7. For example, the axial leads of a first electronic component 60 are positioned within slots 32 and 54 in the first outer and third inner sections 12a, 12b. The leads of a second component 62 are positioned within aligned slots 34 and 30 respectively in the first outer and fourth inner sections 12a, 12c. The axial leads of a third component 64 are positioned within aligned slots 42 and 52 respectively in the second outer and fourth inner sections 12d, 12c. Finally, the axial leads of a fourth component 66 are positioned within aligned slots 40 and 56 respectively in the second outer and third inner sections 12d, 12b. With each of the aforementioned axial leads positioned within a respective slot in the edge of one of the four sections of the frame 12, the axial leads are soldered in place so as to establish mechanical connection and electrical coupling between the electronic components and a pair of facing, spaced sections of the frame 12.

With the plurality of electronic components 60, 62, 64 and 66 soldered in place between adjacent, spaced, facing sections of the frame 12, the upper bridge 14 as well as the jumper member 22 and the jumper member 23 are removed from the frame 12 by conventional means such as by a punch press (not shown). The upper bridge 14 is removed from the frame 12 by severing jumper portions 16, 18 and 20 immediately adjacent to the first outer section 12a, the third inner section 12b, and the second outer section 12d respectively. As in the case of jumper members 22, 23, the jumper portions 16, 18 and 20 may be removed from the frame by conventional means such as a punch press which may be configured to sever all of the aforementioned jumpers or bridge sections simultaneously. With the aforementioned bridge sections removed from the frame 12, the first, second, third and fourth sections thereof remain coupled by means of the electronic components which have been coupled to adjacent, facing sections by soldering as previously described. Since the frame 12 is comprised of an electrically conductive material, the aforementioned frame sections also couple these axial lead components in circuit.

In one embodiment, the third and fourth inner sections 12b, 12c are each provided with a respective aperture 72, 74 which are each adapted to receive a guide (not shown) for proper positioning of the frame 12 during the various steps of its configuring and fabrication. For example, a pair of positioning guides (not shown) may be inserted in the apertures 72 and 74 for maintaining the frame 12 in secure position during its bending along the aforementioned four parallel axes as well as during the severing of the various aforementioned jumper portions in separating the various sections of the frame from each other.

From the sectional views of FIGS. 5 and 6, it can be seen that the length, or depth, of the slots 50, 52 in the fourth inner section 12c is different than the length of the slots 54, 56 in the third inner section 12b. As previously explained, the length of these slots is such that with the third and fourth inner sections 12b, 12c respectively bent on the order of 90° along axes B—B and C—C and with the axial leads of a pair of components inserted within and soldered in adjacent slots in these sections, the axial lead component will be aligned generally perpendicular to the thus bent portions of the inner sections as well as to the first and second outer sections 12a, 12d.

The first and second outer sections 12a, 12d are provided with respective mounting/terminal pins 24 and 30. Similarly, the third and fourth inner sections 12b, 12c are provided with respective mounting/terminal pins 26 and 28. Each of the mounting/terminal pins may be integral with its associated section as shown in the various figures and is adapted for insertion within a corresponding, spaced aperture in a circuit board 68 as shown in FIG. 7. Thus, mounting/terminal pin 24 of the first outer section 12a is adapted for insertion in PC board aperture 68b, mounting/terminal pin 26 is adapted for insertion in PC board aperture 68a, mounting/terminal pin 28 is adapted for insertion in PC board aperture 68c, and mounting/terminal pin 30 is adapted for insertion in PC board aperture 68d. In this manner, the mounting, coupling and heat sink assembly 10 with electronic components physically mounted and electrically coupled thereto may be connected in circuit to circuitry, shown in FIG. 7 as a plurality of conductors 76, on the PC board 68. Each of the mounting/terminal pins 24, 26, 28 and 30 may be coupled to one of the conductors 76 on the PC board 68 by conventional means such as soldering.

Figure 8:
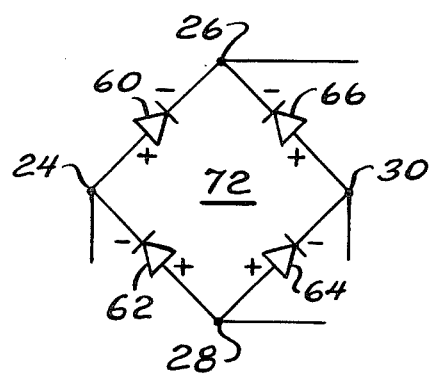
FIG. 8 is an electrical schematic of a rectifying bridge circuit for which one embodiment of the present invention is particularly adapted.

In a preferred embodiment of the present invention, the first, second, third and fourth electronic components 60, 62, 64 and 66 are axial lead diodes connected so as to form a rectifying bridge circuit 72 shown schematically in FIG. 8. The various mounting/terminal pins of the frame sections illustrated in FIG. 7 are also shown in the schematic diagram as terminals or connections between the various diodes. Thus, referring to FIGS. 7 and 8, the anode of diode 60 is coupled to the first outer section 12a and thence to the first mounting/terminal pin 24, while its cathode is coupled to the third inner section 12b and thence to the second mounting/terminal pin 26. The anode of diode 62 is coupled to the fourth inner section 12c and thence to the third mounting/terminal pin 28, while its cathode is coupled to the first outer section 12a and thence to the first mounting/terminal pin 24. The anode of the third diode 64 is coupled to fourth inner section 12c and thence to the third mounting/terminal pin 28, while its cathode is coupled to the second outer section 12d and thence to mounting/terminal pin 30. Finally, the anode of the fourth diode 66 is coupled to the second outer section 12d and thence to the fourth mounting/terminal pin 30, while its cathode is coupled to the third inner section 12b and thence to the second mounting/terminal pin 26. A pair of AC leads would typically be coupled to mounting/terminal pins 24 and 30, with a DC voltage produced at mounting/terminal pin 26. Terminal pin 28 would typically be maintained at neutral ground potential. In this manner, the electronic apparatus of the present invention converts an AC input voltage to a DC output voltage. Positioning of the thermally conductive sections in circuit between the various electronic components improves heat dissipation within the circuit and provides a direct heat sink in the circuit.

There has thus been shown an electronic apparatus including a mounting, coupling and heat sink assembly for use with axial lead components. The mounting, coupling and heat sink assembly is used for securely mounting and coupling the axial lead components in circuit with a PC board as well as to electrically couple the axial lead components to each other and stabilize the operating temperature of the axial lead components by dissipating current-generated heat.

While particular embodiments of the present invention have been shown and described, it will be obvious to those skilled in the art that changes and modifications may be made without departing from the invention in its broader aspects. For example, while the present invention is disclosed in terms of a rectifying bridge circuit, it has application in virtually any circuit employing axial lead components such as a resistor network comprised of one or more axial lead resistors. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. An electronic apparatus mounted to a support structure and coupled in circuit, said electronic apparatus comprising:
   a frame comprised of an electrically and thermally conductive material and divided generally into a plurality of sections and adapted to be bent along a plurality of parallel, spaced linear axes such that each of said sections is then oriented in facing, spaced relation from an adjacent section, with each of said sections including an aperture therein aligned with an aperture in an adjacent facing section and further including removable jumper means for coupling adjacent sections of said frame such that with said jumper means removed from said frame following the bending of said frame along said axes, each of said sections is electrically isolated and mechanically detached from the other frame sections;

an electronic component positioned between adjacent facing frame sections and having first and second axial leads extending from respective ends thereof, said first and second axial leads positioned within respective apertures in said adjacent facing sections and electrically coupled thereto; and mounting/coupling means integral with and extending from each of said sections for mounting the electronic apparatus to the support structure and electrically coupling the electronic apparatus in circuit.

2. The electronic apparatus of claim 1 wherein said apertures comprise a plurality of slots in adjacent edges of said frame sections.

3. The electronic apparatus of claim 1 further including attaching means for securely coupling each of said axial leads to respective aperture in each of said frame sections.

4. The electronic apparatus of claim 3 wherein said attaching means comprises solder.

5. The electronic apparatus of claim 1 wherein said axial lead component comprises a diode.

6. The electronic apparatus of claim 1 wherein the electronic apparatus includes a plurality of axial lead components each positioned between adjacent, facing frame sections and having their leads positioned within respective apertures of said adjacent, facing frame sections.

7. The electronic apparatus of claim 6 wherein each of said axial lead components is a diode and said electronic apparatus comprises a rectifying bridge circuit.

8. The electronic apparatus of claim 7 wherein said frame is comprised of first and second outer sections and third and fourth inner sections and said electronic apparatus includes four axial lead diodes each coupled between one of said outer sections and one of said inner sections.

9. The electronic apparatus of claim 8 wherein said frame includes a first bend axis between said first outer section and said inner sections, a second bend axis between said second outer section and said inner sections, and a third bend axis intermediate said first and second bend axes and extending through said inner sections.

10. The electronic apparatus of claim 1 wherein said mounting/coupling means are positioned on adjacent edges of each of said frame sections.

11. The electronic apparatus of claim 10 wherein each of said mounting/coupling means comprises a terminal pin.

* * * * *